United States Patent [19]

Arai

[11] Patent Number: 5,300,804

[45] Date of Patent: Apr. 5, 1994

[54] MASK ROM DEVICE HAVING HIGHLY INTEGRATED MEMORY CELL STRUCTURE

[75] Inventor: Hajime Arai, Hyogo, Japan

[73] Assignee: Mitsubishi Denki Kabushiki Kaisha, Tokyo, Japan

[21] Appl. No.: 872,858

[22] Filed: Apr. 23, 1992

[30] Foreign Application Priority Data

May 31, 1991 [JP] Japan ................................. 3-128066

[51] Int. Cl.5 ..................... H01L 27/02; H01L 27/10; H01L 27/15
[52] U.S. Cl. .................................... 257/332; 257/331; 257/334; 257/390; 257/392; 257/402
[58] Field of Search ............... 257/331, 332, 334, 390, 257/392, 402; 365/104, 94, 103

[56] References Cited

U.S. PATENT DOCUMENTS

| | | | |
|---|---|---|---|
| 4,384,345 | 5/1983 | Mikome | 257/390 |
| 4,630,237 | 12/1986 | Miura et al. | 365/104 |

FOREIGN PATENT DOCUMENTS

| | | |
|---|---|---|
| 63-143860 | 6/1988 | Japan . |
| 2-106965 | 4/1990 | Japan . |
| 2-106966 | 4/1990 | Japan . |
| 2-246155 | 10/1990 | Japan . |

OTHER PUBLICATIONS

A 4-Mb nand EEPROM with Tight Programmed $V_t$, Distribuiton-IEEE Journal of Solid-State Circuits, vol. 26, No. 4, Apr. 1991.

*Primary Examiner*—Ngan Ngo
*Attorney, Agent, or Firm*—Lowe, Price, LeBlanc & Becker

[57] ABSTRACT

In a mask ROM device, a plurality of recesses extending parallel to each other are formed in a memory cell array region on the surface of a silicon substrate. In the direction intersecting the recesses, first and second transistor trains are formed in which select transistors and memory transistors are connected in series. The MOS transistors of the transistor trains have the sidewall of recess 5 formed as a channel region. A depletion implantation layer corresponding to data to be stored is formed on the sidewall of the recess. The first transistor train and the second transistor train are insulated and isolated from each other by an LOCOS isolation film.

4 Claims, 10 Drawing Sheets

MASK ROM DEVICE HAVING HIGHLY INTEGRATED MEMORY CELL STRUCTURE

BACKGROUND OF THE INVENTION

Field of the Invention

The present invention relates generally to a semiconductor device, and more specifically, to a highly integrated structure of an NAND type mask ROM (Read Only Memory).

The present invention further relates to a method of manufacturing an NAND type mask ROM having such a highly integrated structure.

Figure 11:
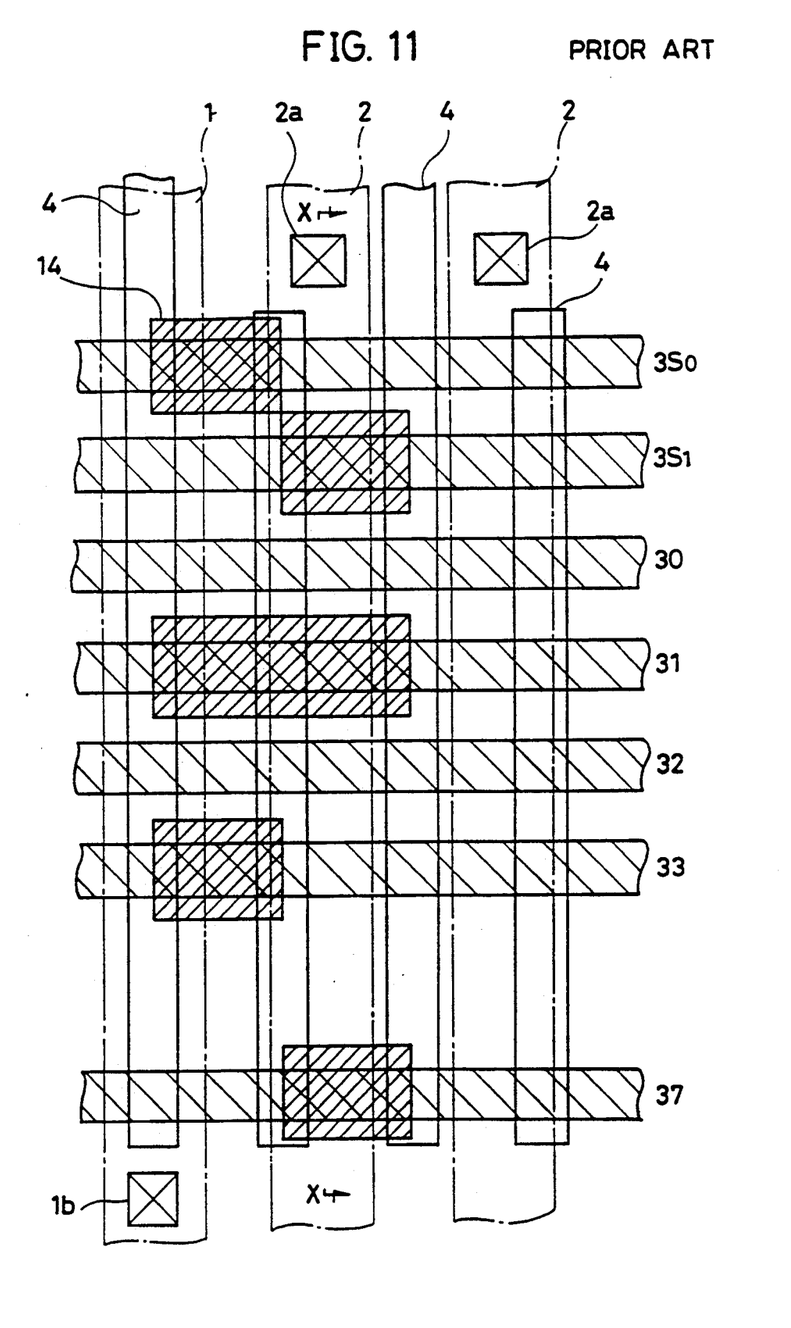
FIG. 11 is a top plan view showing a structure of a memory cell array in a conventional NAND type mask ROM.
Figure 17:
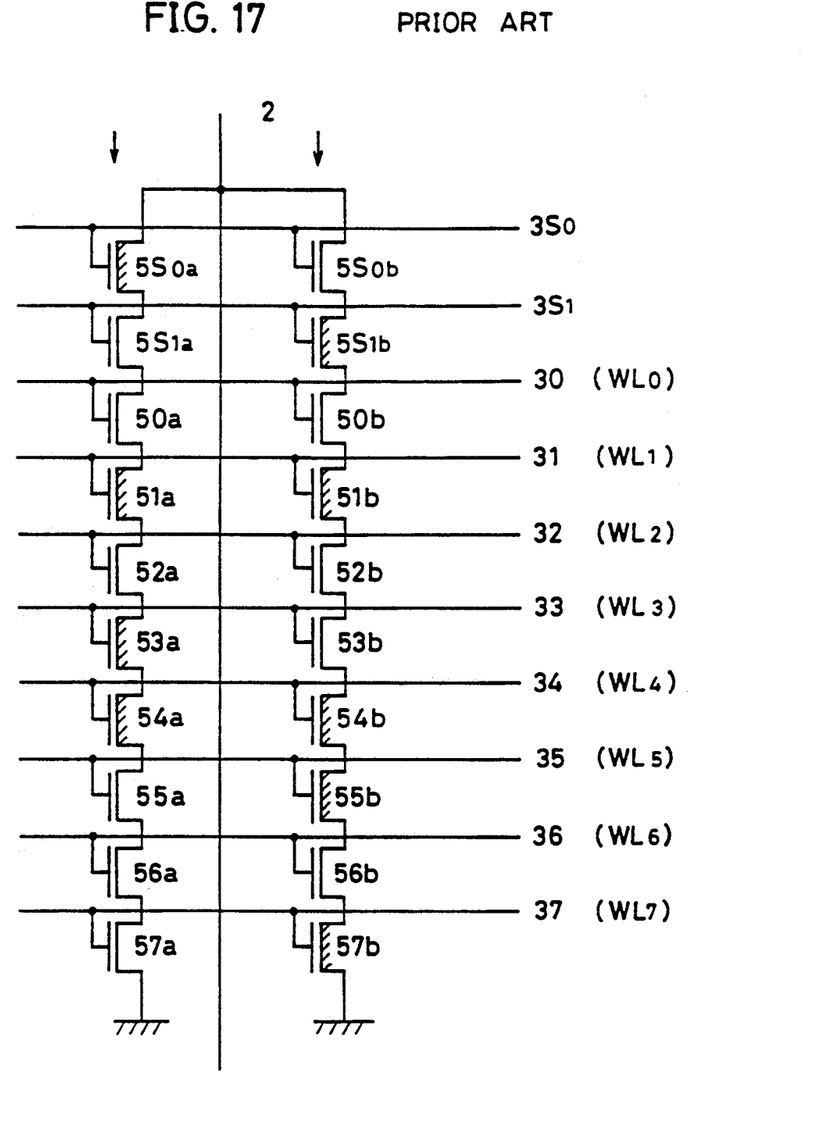
FIG. 17 is a diagram showing an equivalent circuit of a memory cell array in an NAND type mask ROM.

FIG. 17 is a diagram showing an equivalent circuit of the memory cell array of a conventional NAND type mask ROM utilizing an n channel type transistor, and FIG. 11 is a top plan view showing the structure of the memory cell array corresponding to FIG. 17. Referring to these figures, on the main surface of a silicon substrate, a first MOS transistor train (a train) and a second MOS transistor train (b train) both formed of a plurality of MOS transistors connected in series are formed parallel to each other extending in the direction of columns. These two transistor trains (a train, b train) are insulated and isolated from each other by an LOCOS (Local Oxidation of Silicon) isolation film 4. The gate electrodes (3S0, 3S1) and word lines (30-37) of MOS transistors are formed extending parallel to each other in the direction of rows on the main surface of the silicon substrate.

Figure 12:
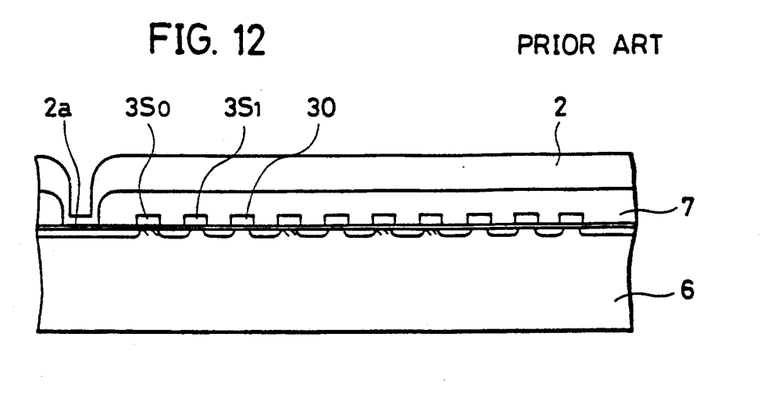
FIG. 12 is a sectional view showing a structure of the memory cell array taken along line X—X in FIG. 11.

FIG. 12 illustrates a sectional structure taken along line X—X in FIG. 11. The plurality of MOS transistors formed on the main surface of a silicon substrate 6 are connected in series sharing impurity regions with each other. The MOS transistor train of a plurality of MOS transistors includes a transistor of enhancement type and a transistor of depletion type. In the case of the depletion type transistor, an arbitrary transistor is formed into depletion type depending upon data to be stored therein. More specifically, in the NAND type mask ROM, ROM data "1"/"0" is stored as the "presence/absence" of depletion implantation to the MOS transistor.

The operation of a conventional NAND type mask ROM will be described in conjunction with FIGS. 17, 11 and 12.

In FIG. 17, transistors having their channel regions depicted by oblique lines (for example 5S0a, 5S1b, 51a ...) are depletion type transistors, and the other transistors are of enhancement type. Gate electrodes 3S0 and 3S1 are select gates for selecting the a train or b train of MOS transistors.

In operation, when data is read out from a bit line 53a of WL3-a train, select gate 3S0 is turned off, 3S1 is turned on, word line WL3 (33) of the read bit is turned off, and the other word lines WL0-WL2, and WL4-WL7 are turned on. In this state, current does not flow through b train side, because transistor 5S0b is in the state of off. With the non-selected word lines (WL0-WL2, WL4-WL7) being all supplied with ON state current, current can flow through the bits (50a-52a, 54a-57a) corresponding to these non-selected wordlines regardless of the bits being enhancement type or depletion type. Whether or not current flows through the a train is determined depending upon whether or not current can flow the bit 53a corresponding to word line WL3 selected in this state. Suppose that the selected read bit 53a is a depletion type transistor.

Therefore, if current flows through read bit 53a, current flows through the a train side, and then the current flows through bit line 2. The data of read bit 53a is determined to be "1" by sensing the current through bit line 2.

Conversely, when select gate 3S0 is turned on, 3S1 is turned off and word line WL3 is selected, the current path is cut off because read bit 53b is formed of an enhancement type transistor. Current therefore does not flow through the b train, and the data of read bit 53b is determined to be "0".

Figure 13:
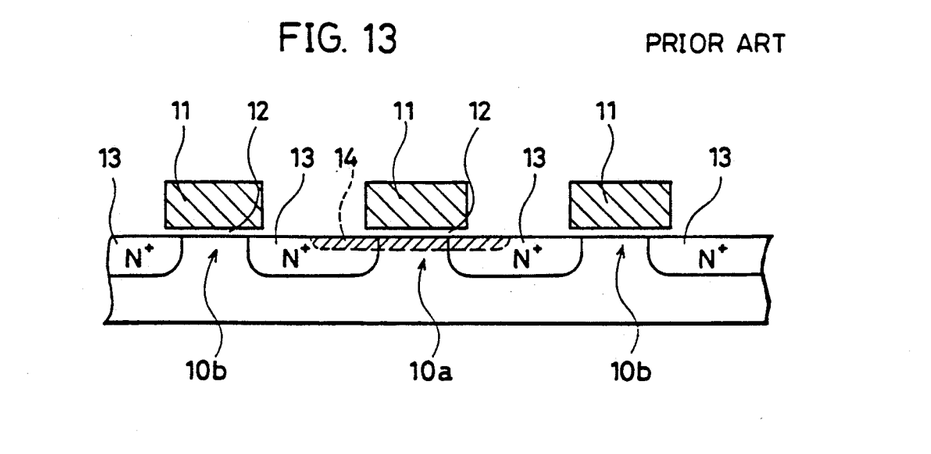
FIG. 13 is a partially enlarged view showing the MOS transistors connected in series shown in FIG. 12.

A description will be provided on the structure of an MOS transistor constituting each of the bits. FIG. 13 is a sectional view showing the structure of series-connected MOS transistors. MOS transistor trains constituting bits include a depletion type MOS transistor 10a and an enhancement type MOS transistor 10b. The transistors both have the same basic structure. In other words, the transistors both include a pair of N+ sources/drains 13, 13, a gate insulating layer 12 and a gate electrode 11. Depletion type MOS transistor 10a has a depletion implantation layer 14 at least in its channel region. Depletion implantation layer 14 permits current to flow through the source-drain region even when no voltage is applied to the gate electrode. More specifically, its threshold voltage is negative. Conversely, in the case of enhancement type MOS transistor 10b, drain current starts flowing through the source-drain regions 13, 13 with gate electrode 11 being supplied with a positive gate voltage.

Figure 14:
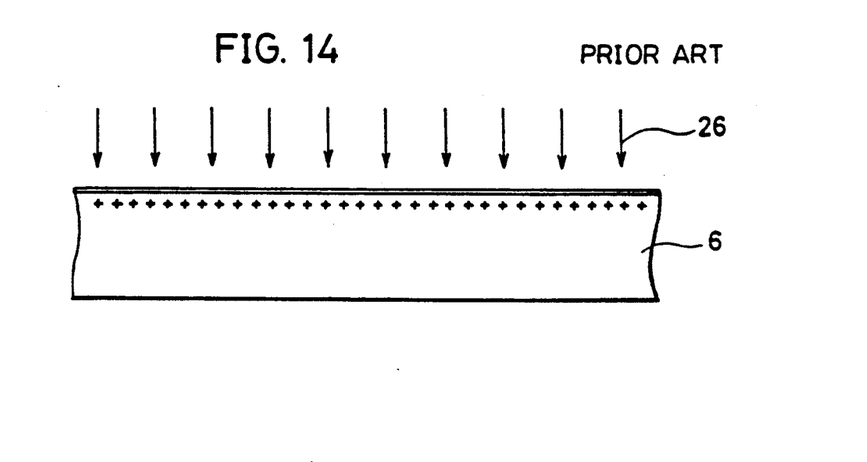
FIGS. 14–16 are sectional views showing the structures of the memory cell array shown in FIG. 13 in the order of manufacturing steps.
Figure 15:
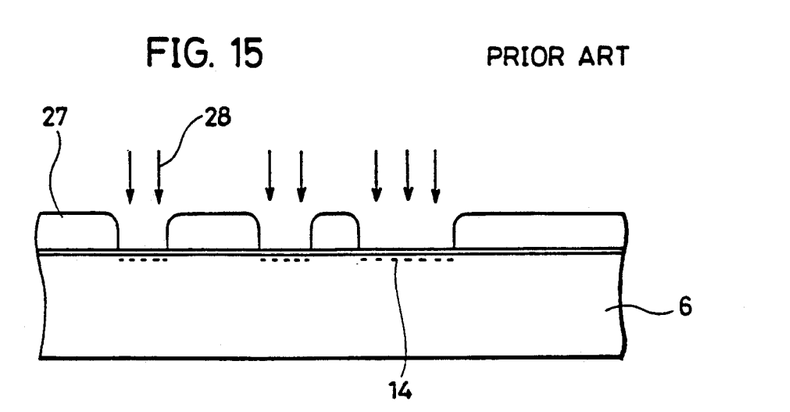
Figure 16:
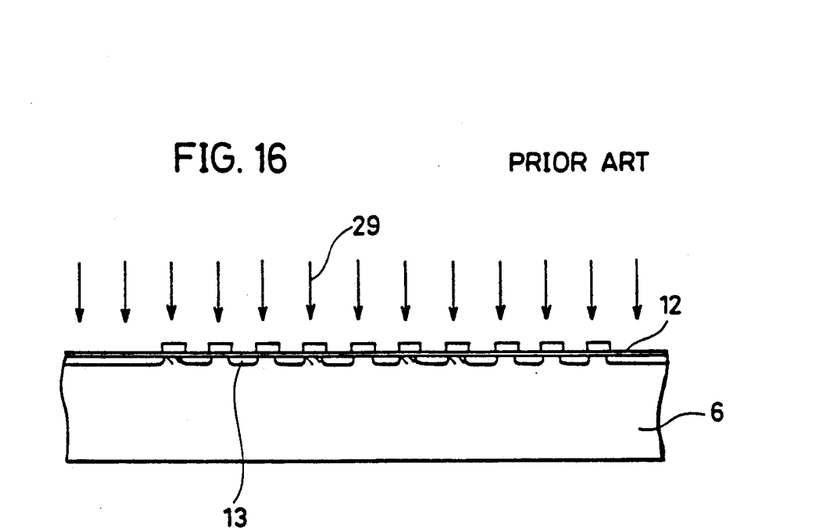

A description will be provided on a method of manufacturing the series-connected MOS transistor train shown in FIG. 13. FIGS. 14-16 are sectional views showing the structure of the MOS transistor train shown in FIG. 13 for illustrating the manufacturing steps in their order.

As shown in FIG. 14, an LOCOS isolation film (not shown) is formed at a prescribed position on the main surface of silicon substrate 6 by means of LOCOS method. Then, impurity ions 26 are implanted into the surface of silicon substrate 6 for adjusting the threshold of the transistor.

As shown in FIG. 15, a mask layer 27 is formed at a prescribed position in a transistor formation region on the silicon substrate. Using mask layer 27, impurity ions 28 such as phosphorus or arsenic (in the case of n channel type) are implanted into the region of silicon substrate 6 in which a depletion type transistor is to be formed. Depletion implantation layer 14 is thus formed.

As shown in FIG. 16, after removal of mask layer 27, a gate insulating layer 12 is formed on the surface of silicon substrate 6, by, for example, heat-oxidation method. Further formed on the surface of gate insulating layer 12 is conductive layer formed of such as polycrystalline silicon, or a two-layered film of high-melting point metal silicide and polycrystalline silicon, which is patterned into a prescribed form. A plurality of gate electrodes are thus formed. Then, using the gate electrodes as masks, n type impurity ions 29 are implanted, thereby forming the source/drain 13 of the MOS transistor. A series-connected structure of enhancement type and depletion type MOS transistors is formed by the foregoing steps.

Subsequently, interlayer insulating layers, bit lines and source lines are formed.

In the field of semiconductor devices, a demand for increasing integration density is inevitable in order to expand storage capacities. The structures of devices constituting a memory should be shrunk for higher integration density. In the case of the memory cell array of a conventional NAND type mask ROM as described above, the size of the series-connected MOS transistor structure should be reduced for the purpose of reducing the size of the entire structure. The reducing the size of a MOS transistor is however encountered with the following problem.

(1) Referring to FIG. 13, in the case of an enhancement type transistor, as for the gate length of gate electrode 11, a length enough for maintaining the breakdown voltage of the source-drain region is necessary which can cut off current flowing through the source-drain region. More specifically, it is necessary to secure such a distance between the source and drain that punch through phenomenon can be restrained from taking place in the source-drain region.

(2) The spacing of gate electrodes 11, 11 of adjacent MOS transistors is limited by resolution given by an exposure device or performance by an etching device in the process of patterning.

According to the above-stated limitations, the gate length is about 0.8 $\mu$m and the spacing of gate electrodes 11, 11 is about 0.8 $\mu$m in the memory cell array of the conventional mask ROM shown in FIG. 13.

As described above, in a conventional mask ROM having a memory cell array in which MOS transistors are disposed in series on the main surface of a silicon substrate, the limitations given by MOS transistor characteristics as well as manufacture stand in the way of achieving further reduction of the size.

SUMMARY OF THE INVENTION

It is therefore an object of the present invention to increase the integration density of an NAND type mask ROM.

Another object of the present invention is to increase the integration density of a memory cell array having a plurality of MOS transistors connected in series in a mask ROM device.

A further object of the present invention is to provide a method of manufacturing a mask ROM device with a high integration density.

A mask ROM device in accordance with one aspect of the present invention has a plurality of recesses extending parallel to each other formed on the main surface of a semiconductor substrate. Formed in the direction crossing the direction in which the recesses extend are a first MOS transistor train in which a plurality of MOS transistors are connected in series and a second MOS transistor train disposed in parallel with the first MOS transistor train and formed of a plurality of MOS transistors connected in series, with an insulating isolation region being formed between the first and second MOS transistor trains. The insulating isolation region insulates and isolates the MOS transistors in the first MOS transistor train and the MOS transistors in the second MOS transistor train from each other. The semiconductor device further includes the sources/drains of MOS transistors on one end of the first MOS transistor train, bit lines connected to the sources/drains of the MOS transistors on one end of the second MOS transistor train, the sources/drains of the MOS transistors on the other end of the first MOS transistor train, and source lines connected to the sources/drains of the MOS transistors on the other end of the second MOS transistor train. The MOS transistors included in the first and second MOS transistor drains each includes a pair of sources/drains formed on the bottom of the recess and on the main surface of the substrate in lines with the recess, a channel region formed on the inner surface of the recess positioned between a pair of sources/drains, and a gate electrode formed on the inner surface of the recess with an insulating layer therebetween.

In the mask ROM, the spacing of a pair of sources/drains in the direction along the main surface of the substrate can be reduced by using the sidewalls of the recess formed on the substrate surface as the channel region of the MOS transistor. The gate length of a gate electrode can be arbitrarily selected depending upon the depth of the recess. The structure of the MOS transistor on a plane can therefore be reduced without reducing the gate length or channel length of the MOS transistor. Furthermore, ion implantation in an oblique direction relative to the sidewall of the recess formed on the main surface of the substrate permits a depletion region to be formed on the sidewall of the recess. This enables manufacturing of the memory cell array of a mask ROM including MOS transistors of enhancement type and depletion type.

A mask ROM device in accordance with another aspect of the present invention includes first and second MOS transistors formed on the sidewalls of the recess, and a method of manufacturing such a mask ROM device includes the following steps. A recess is formed on the main surface of a semiconductor substrate of first type conductivity. An insulating layer is formed on the main surface of the semiconductor substrate and on the inner surface of the recess. A conductive layer is formed on the surface of the insulating layer. The conductive layer and insulating layer are anisotropically etched to form a gate insulating layer and a gate electrode layer both in contact with the sidewall of the recess. Then, impurity ions of second type conductivity are implanted into the main surface of the semiconductor substrate and the bottom of the recess, using the gate electrode layer as a mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
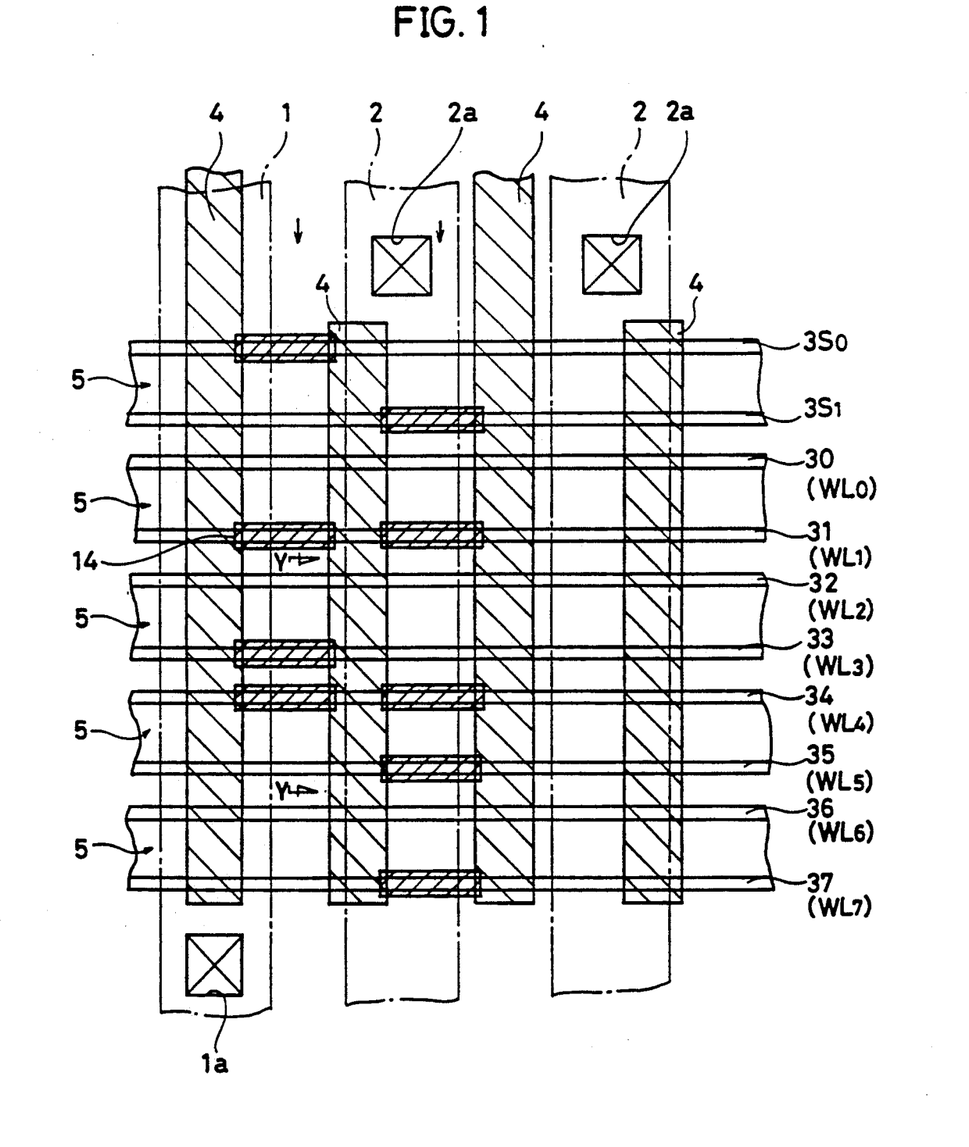
FIG. 1 is a top plan view showing a structure of a memory cell array in an NAND type mask ROM in accordance with one embodiment of the present invention.
Figure 7:
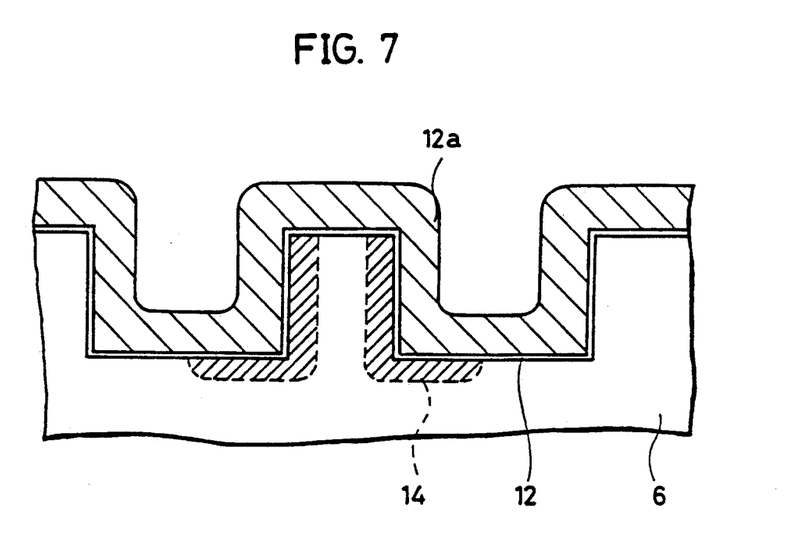

Referring to FIGS. 1 and 7, a plurality of recesses 5 parallel to each other are formed in the direction of columns on the main surface of a silicon substrate. LOCOS isolation films 4 for element isolation are formed parallel to each other in the direction intersecting the direction in which recesses 5 extend. LOCOS isolation film 4 is formed on the main surface of the silicon substrate and along the inner surface of the recess 5. Formed in the region between two LOCOS isolation films 4, 4 adjacent to each other is a train of ten MOS transistors connected in series to each other (a train), or a train of ten MOS transistors connected in series (b train). Each of the a and b transistor trains is formed of two select transistors and 8-bit memory transistors. These MOS transistors include gate electrodes (3S0–3S1, 30–37) extending along the sidewalls of recesses 5. The gate electrodes extend along the sidewalls of recesses 5 and over LOCOS isolation films 4, constituting select gates or word lines (WL0–WL7). A bit line 2 is connected to the impurity regions of the MOS transistors positioned at one end of each of the a train a and b train through a bit line contact 2a. Connected to the impurity regions of MOS transistors positioned at the other ends through a source line contacts 1a is a source line 1.

Figure 2:
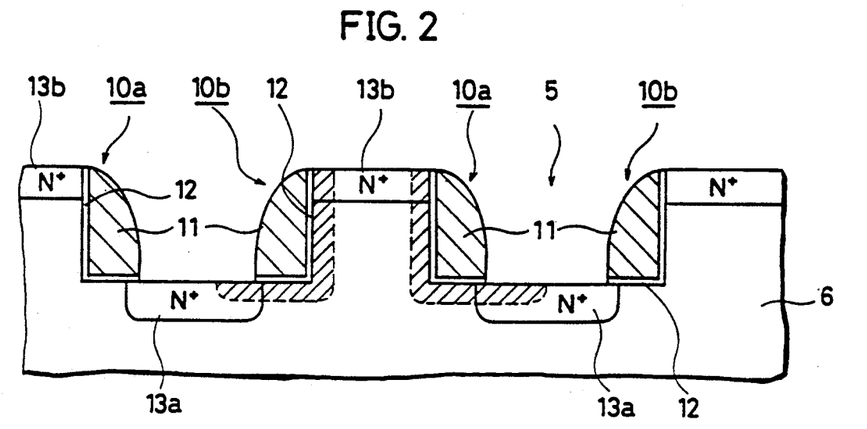
FIG. 2 is a sectional view showing the structure of the memory cell array taken along line Y—Y in FIG. 1.

Referring to FIG. 2, each of the select transistors or memory transistors includes a pair of sources/drains 13a, 13b, a gate insulating film 12 and a gate electrode 11. One of sources/drains 13a, 13b is formed on the main surface of silicon substrate 6, in other words a stepped surface between two recesses 5, 5 and the other is formed on the bottom of recess 5. Gate insulating film 12 is formed as thick as about 150–200 Å along the sidewall and bottom of recess 5. Gate electrode 11 is formed on the surface of gate insulating film 12, the thickness of which is about 0.3 μm in the vicinity of the bottom of recess 5. The width of source/drain 13a formed on the bottom of recess 5 is about 0.2 μm. A depletion layer 14 is formed with respect to a predetermined MOS transistor in the channel region formed between a pair of source/drains 13a, 13b along the sidewall and bottom of recess 5 depending upon data to be stored. Among the memory transistors, a transistor having depletion layer 14 is formed into depletion type and the others are formed into enhancement type.

Figure 3:
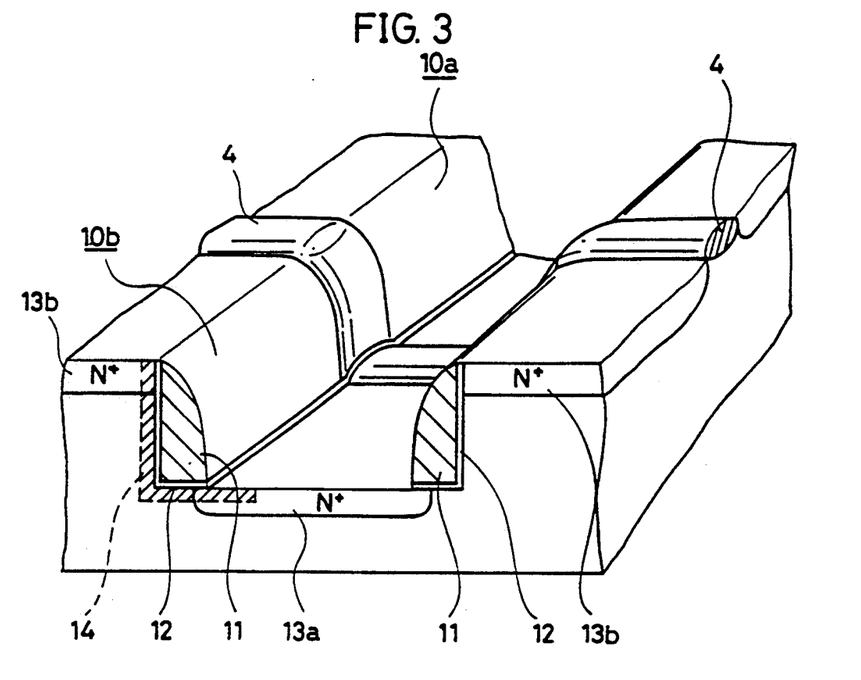
FIG. 3 is a sectional perspective view showing the memory cell array shown in FIG. 2.

As shown in FIG. 3, the source and drain 13a, 13b of adjacent MOS transistors 10a and 10b are insulated and isolated by LOCOS isolation film 4. Gate electrode 11 is formed extending serially along the sidewall of recess.

Thus, using the sidewall of recess 5 formed on the main surface of the substrate for the channel region of the transistor, the formation region of series-connected MOS transistor on a plane can be reduced. For example, when the width of recess 5 is 0.5 μm, the spacing of adjacent recesses 5, 5 is 0.8 μm, the length of one MOS transistor 10b occupied on a plane is 0.8 μm. This length is about half the length of the conventional MOS transistor 10a shown in FIG. 13. Furthermore, the region corresponding to the gate length of the transistor corresponds to the depth of the sidewall of recess 5. Therefore, the deeper the recess 5 is formed to be, the larger will be the gate length.

A description will be provided on a manufacturing process of the memory cell array of the mask ROM shown in FIG. 2.

Figure 4:
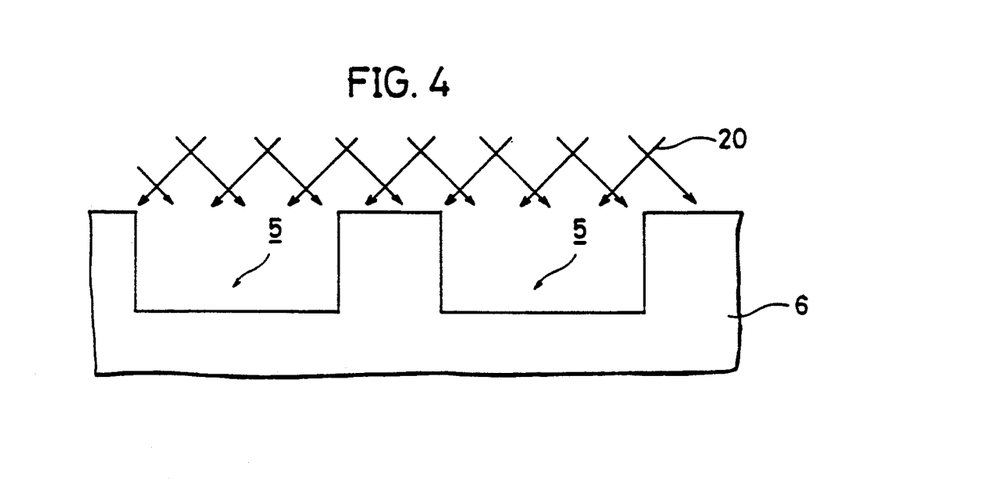
FIGS. 4–9 are sectional views sequentially showing the structures of the memory cell array shown in FIG. 2 in the order of manufacturing steps.

As shown in FIG. 4, a plurality of recesses 5 parallel to each other are formed at a predetermined spacing on the main surface of a p type silicon substrate 6 by means of anisotropic etching. An LOCOS isolation film (not shown) for element isolation is formed in the direction intersecting recess 5 is formed by selective oxidation. Impurity ions 20 such as boron are implanted into the surface of silicon substrate 6 in order to adjust the threshold voltage of the transistor. With silicon substrate 6 inclined with respect to the direction in which impurity ions 20 are irradiated, the ions are implanted while the substrate being rotated, which is a so-called oblique rotating ion implantation method.

Figure 5:
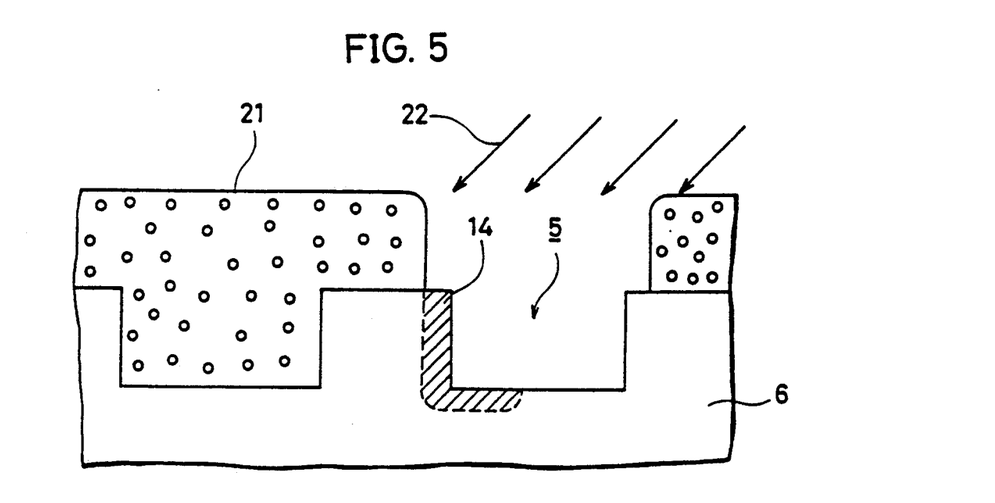

As shown in FIG. 5, data is written into the ROM. Data is written into the ROM by forming depletion layer 14 in the channel region of the MOS transistor which corresponds to the data. In other words, after the region in which no depletion layer is to be formed is covered with a resist 21, impurity ions 22 such as phosphorus are implanted into the main surface of the silicon substrate in an oblique direction at a dose amount of $10^{13}/cm^2$. When depletion layer 14 having a concentration of $10^{17}$–$10^{18}/cm^3$ is formed on the sidewall and a part of the bottom of recess 5, the impurity ions 22 are implanted by the oblique ion implantation method after formation of a resist mask 23.

Figure 6:
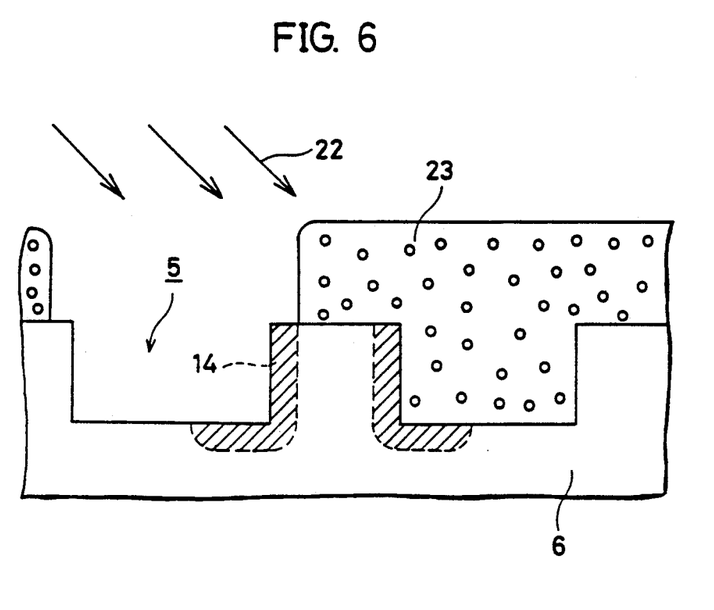

As shown in FIG. 6, depletion layer 14 is formed on the sidewall of recess 5 opposite to depletion layer 14 formed by the step of FIG. 5, impurity ions 22 are implanted by the oblique ion implantation method after resist mask 23 is formed.

As shown in FIG. 7, after the removal of resist 23, a silicon oxide film 12 is formed on the surface of silicon substrate 6 by, for example, heat-oxidation method. A polycrystalline silicon layer 12a having a thickness in the range between 0.3–04 μm is formed on the surface of silicon oxide film 12 by means of, for example, CVD (Chemical Vapor Deposition).

Figure 8:
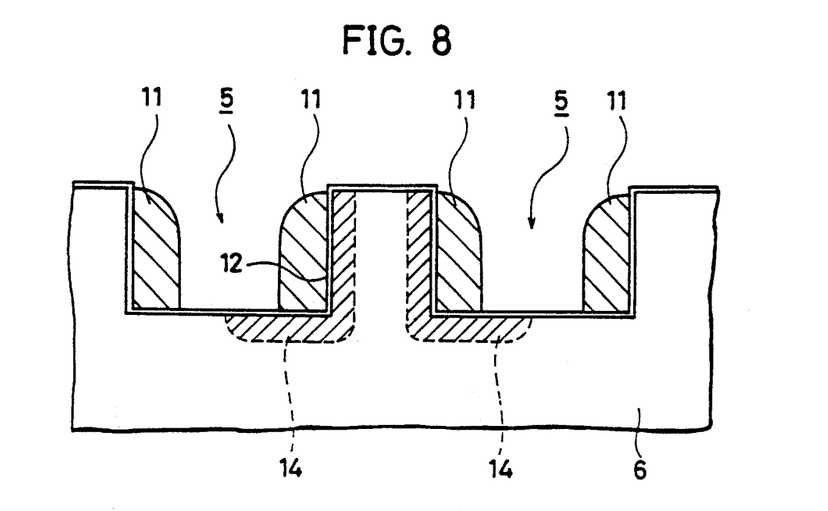

As shown in FIG. 8, polycrystalline silicon layer 12a is anisotropically etched by reactive ion etching, etc. The polysilicon layer remains only in the region in contact with the sidewall of recess 5 as a result, thus forming gate electrodes 11.

Figure 9:
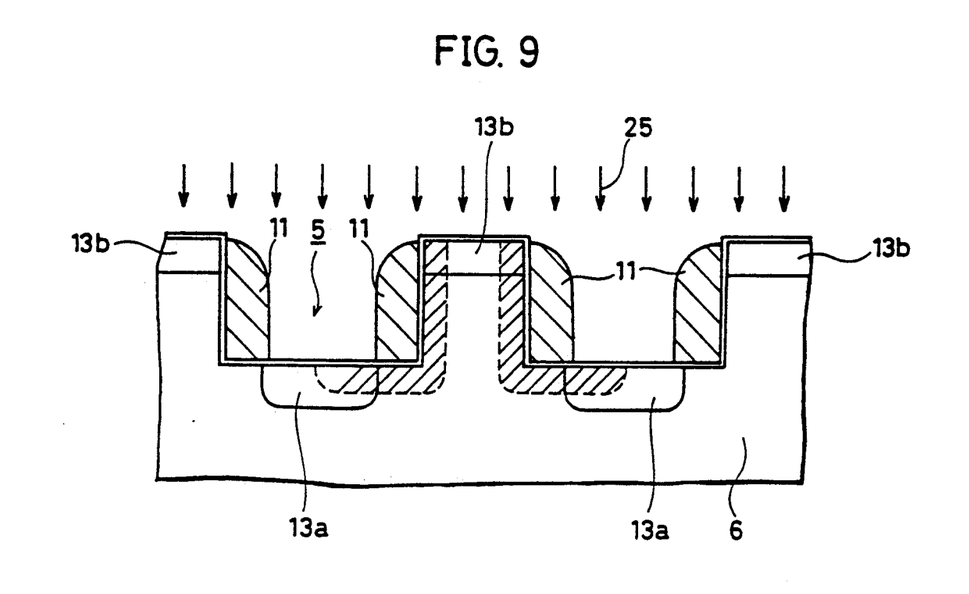

As shown in FIG. 9, using gate electrode 11 as a mask, n type impurity ions 25 such as arsenic (As) are implanted into the surface of silicon substrate 6. A pair of source and drain 13a, 13b of n type are formed on the main surface of silicon substrate 6 and at the bottom of recess 5.

An interlayer insulating layer is then formed on the entire surface of the substrate, and contact holes for interconnection are formed at prescribed positions. Interconnection layers are formed through these contact holes (not shown).

Figure 10:
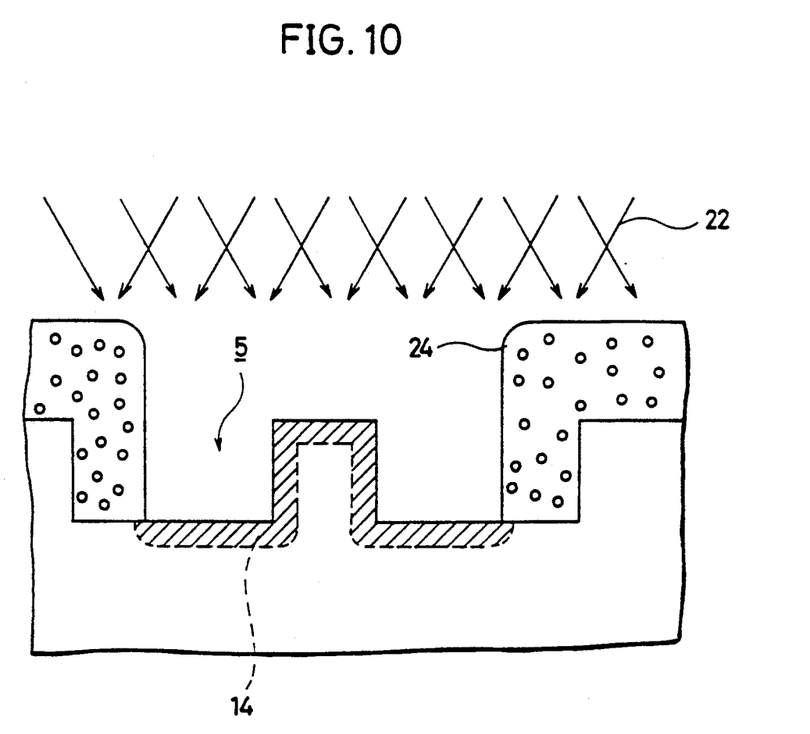
FIG. 10 is a sectional view showing a structure of a variation of the manufacturing process of the memory cell array shown in FIG. 2.

A description will be provided on a variation of the above-described manufacturing process. FIG. 10 is a diagram showing a manufacturing process for illustrating a variation of the depletion implantation process shown in FIGS. 5 and 6. When, for example, a depletion type MOS transistor is formed on the both sidewalls of recesses 5, 5 adjacent to each other, impurity ions 22 may be implanted simultaneously into the both surfaces of recesses 5, 5 by means of the oblique rotation ion implantation method after covering the other regions with a resist 24.

In the above-described embodiments, depletion layer 14 is formed before forming gate insulating layer 12 by way of illustration, but depletion layer 14 may be formed on the surface of the silicon substrate using high energy (ion implantation energy is 200 keV or more) ion implantation method after formation of gate insulating film 12 and gate electrode 11.

Also, although in the above-described embodiments, the cases have been described in which the select transistors or memory transistors of the memory cell array are formed inside recesses 5, an MOS transistor does not have to be or may be formed on the sidewall of the recess, in the peripheral circuitry of the memory cell array.

As described above, in the memory cell array of NAND type mask ROM in accordance with the present invention, MOS transistors connected in series with each other are formed on the sidewall of recesses, and two transistors trains connected in series extending parallel with each other are insulated and isolated from each other, thus reducing the area occupied on a plane on the surface of the substrate without considering the limitations associated with the gate length of the MOS transistor. A memory cell array in a mask ROM using MOS transistor trains with improved integration density can be manufactured employing the process by which depletion ion implantation is conducted in an oblique direction relative to the MOS transistor formed on the sidewall of the recess.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mask ROM device, comprising:
   a semiconductor substrate having a main surface;
   a plurality of recesses formed on the main surface of said semiconductor substrate, extending parallel to each other;
   a first MOS transistor train in which a plurality of MOS transistors connected in series are disposed in a direction crossing the direction in which said recesses extend;
   a second MOS transistor train disposed parallel to said first MOS transistor train including a plurality of MOS transistors connected in series;
   an isolating and insulating region formed between said first MOS transistor train and said second MOS transistor train for insulating and isolating said MOS transistors of said first MOS transistor train and the MOS transistors of said second MOS transistor train from each other;
   a bit line connected to the source/drain of the MOS transistor at one end of said first MOS transistor train and the source/drain of the MOS transistor at one end of said second MOS transistor train; and
   a source line connected to the source/drain of the MOS transistor at the other end of said first MOS transistor train and the source/drain of the MOS transistor at the other end of said second MOS transistor train,
   said MOS transistors included in said first MOS transistor train and second MOS transistor train including;
   a pair of source and drain formed at a bottom of said recess and on the main surface of said semiconductor substrate and aligned with said recess,
   a channel region formed in an inner surface of said recess positioned between said pair of source and drain, and a gate electrode formed on the inner surface of said recess with in insulating layer therebetween.

2. A mask ROM device according to claim 1, wherein said insulating and isolating region has an oxide film formed on the main surface of said semiconductor substrate and on the inner surface of said recess so as to isolate first MOS transistors included in said first MOS transistor train and second MOS transistors included in said second MOS transistor train from each other.

3. A mask ROM device according to claim 1, wherein a first MOS transistor included in each of said first and second MOS transistor trains include a pair of source and drain formed at a bottom of a first recess and on the surface of said semiconductor substrate between a second recess parallel to said first recess and said first recess,
   a channel region formed on a sidewall of said first recess positioned between said pair of source and drain, and
   a gate electrode formed on the sidewall of said first recess with an insulating layer therebetween,
   a second MOS transistor adjacent to said first MOS transistor includes a pair of source and drain formed at a bottom of said second recess and on the main surface of said semiconductor substrate positioned between said first recess and said second recess,
   a channel region formed on a sidewall of said second recess positioned between said pair of source and drain, and
   a gate electrode formed on the sidewall of said second recess with an insulating layer therebetween, and
   the source/drain of said first MOS transistor and the source/drain of said second MOS transistor have a common region.

4. A mask ROM device according to claim 1, wherein each of said plurality of MOS transistors includes an impurity region having the same type conductivity as said source/drain, formed in said channel region, and connected to said pair of source and drain.

* * * * *